(12) United States Patent
Kuo et al.

(10) Patent No.: US 9,711,368 B2
(45) Date of Patent: Jul. 18, 2017

(54) SIDEWALL IMAGE TRANSFER PROCESS (71) Applicant: UNITED MICROELECTRONICS CORP., Hsin-Chu (TW)

(72) Inventors: Lung-En Kuo, Tainan (TW); Po-Wen Su, Kaohsiung (TW); Chen-Yi Weng, New Taipei (TW); Hsuan-Hsu Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 210 days.

(21) Appl. No.: 13/862,484

(22) Filed: Apr. 15, 2013

(65) Prior Publication Data
US 2014/0308761 A1  Oct. 16, 2014

(51) Int. Cl.
*H01L 21/308* (2006.01)
*H01L 21/66* (2006.01)
*H01L 29/66* (2006.01)
*H01L 21/8238* (2006.01)
*H01L 21/8234* (2006.01)
*H01L 29/78* (2006.01)
*H01L 21/311* (2006.01)

(52) U.S. Cl.
CPC ........ *H01L 21/3086* (2013.01); *H01L 22/12* (2013.01); *H01L 22/20* (2013.01); *H01L 22/26* (2013.01); *H01L 29/66795* (2013.01); *H01L 21/31116* (2013.01); *H01L 21/823431* (2013.01); *H01L 21/823821* (2013.01); *H01L 29/785* (2013.01)

(58) Field of Classification Search
CPC ......... H01L 22/12; H01L 22/20; H01L 22/26; H01L 21/3086; H01L 21/823431; H01L 29/66795; H01L 29/785
See application file for complete search history.

(56) References Cited

U.S. PATENT DOCUMENTS

| 4,776,922 A | * | 10/1988 | Bhattacharyya | .... H01L 21/0271 |
| | | | | 204/192.37 |
| 6,043,138 A | | 3/2000 | Ibok | |
| 6,409,879 B1 | * | 6/2002 | Toprac | .................. H01J 37/321 |
| 6,492,216 B1 | | 12/2002 | Yeo | |
| 6,617,258 B1 | * | 9/2003 | Sonderman | ....... H01L 21/28194 |
| | | | | 118/695 |
| 6,632,741 B1 | * | 10/2003 | Clevenger | ........... H01L 21/0334 |
| | | | | 257/E21.036 |
| 6,875,703 B1 | * | 4/2005 | Furukawa | ........... H01L 21/0337 |
| | | | | 257/E21.038 |
| 6,921,963 B2 | | 7/2005 | Krivokapic | |
| 7,087,477 B2 | | 8/2006 | Fried | |
| 7,091,551 B1 | | 8/2006 | Anderson | |

(Continued)

*Primary Examiner* — Mary Wilczewski
(74) *Attorney, Agent, or Firm* — Winston Hsu (57) ABSTRACT

A sidewall image transfer (SIT) process is provided. First, a substrate is provided. A sacrificial layer having a pattern is formed on the substrate. A first measuring step is performed to measure a width of the pattern of the sacrificial layer. A material layer is formed conformally on the sacrificial layer, wherein a thickness of the material layer is adjusted according to the result of the first measuring step. Then, the material layer is removed anisotropically, so the material layer becomes a spacer on a sidewall of the sacrificial layer. Lastly, the sacrificial layer is removed.

12 Claims, 6 Drawing Sheets

(56) References Cited

U.S. PATENT DOCUMENTS

| | | | |
|---|---|---|---|
| 7,102,181 B1* | 9/2006 | Nowak | H01L 29/41791 257/250 |
| 7,247,887 B2 | 7/2007 | King | |
| 7,250,658 B2 | 7/2007 | Doris | |
| 7,309,626 B2 | 12/2007 | Ieong | |
| 7,327,476 B2* | 2/2008 | Cohen et al. | 356/630 |
| 7,348,192 B2* | 3/2008 | Mikami | 438/16 |
| 7,352,034 B2 | 4/2008 | Booth, Jr. | |
| 7,390,750 B1* | 6/2008 | Ramkumar | H01L 21/0337 438/706 |
| 7,416,937 B2* | 8/2008 | Koh | 438/248 |
| 7,470,570 B2 | 12/2008 | Beintner | |
| 7,531,437 B2 | 5/2009 | Brask | |
| 7,569,857 B2 | 8/2009 | Simon | |
| 7,687,339 B1* | 3/2010 | Schultz | H01L 21/0337 257/E27.099 |
| 8,232,212 B2* | 7/2012 | Davis | B82Y 10/00 216/59 |
| 8,546,202 B2* | 10/2013 | Tung | H01L 21/3086 438/151 |
| 8,889,561 B2* | 11/2014 | Woo | H01L 21/3086 257/401 |
| 8,900,937 B2* | 12/2014 | Lin et al. | 438/157 |
| 8,906,752 B2* | 12/2014 | Tregub | H01L 51/0037 257/E21.006 |
| 8,906,757 B2* | 12/2014 | Kim et al. | 438/163 |
| 8,927,432 B2* | 1/2015 | Guo | H01L 27/1211 257/347 |
| 8,965,551 B2* | 2/2015 | Shioyama | 700/110 |
| 8,975,129 B1* | 3/2015 | Shieh | H01L 21/3086 438/199 |
| 9,006,110 B1* | 4/2015 | Sun | H01L 21/30604 257/368 |
| 9,023,695 B2* | 5/2015 | Chiu et al. | 438/165 |
| 9,029,263 B1* | 5/2015 | Kim | H01L 21/823437 257/E21.038 |
| 9,123,776 B2* | 9/2015 | Tsai | H01L 21/76802 |
| 9,153,440 B2* | 10/2015 | Lin | H01L 21/0337 |
| 9,177,797 B2* | 11/2015 | Chang | H01L 21/0338 |
| 9,196,485 B2* | 11/2015 | Leobandung | H01L 21/0337 |
| 9,209,038 B2* | 12/2015 | Cantone | H01L 21/3086 |
| 9,263,282 B2* | 2/2016 | Lin | H01L 21/306 |
| 2003/0157436 A1* | 8/2003 | Manger et al. | 430/311 |
| 2004/0084674 A1* | 5/2004 | Mathew et al. | 257/66 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0273456 A1* | 12/2006 | Sant | H01L 21/3086 257/734 |
| 2006/0281266 A1* | 12/2006 | Wells | 438/299 |
| 2006/0286729 A1 | 12/2006 | Kavalieros | |
| 2007/0026684 A1* | 2/2007 | Parascandola et al. | 438/733 |
| 2007/0049040 A1* | 3/2007 | Bai | H01L 21/0337 438/712 |
| 2007/0108528 A1 | 5/2007 | Anderson | |
| 2007/0158756 A1 | 7/2007 | Dreeskornfeld | |
| 2007/0170521 A1* | 7/2007 | Abadeer | H01L 21/845 257/401 |
| 2007/0284669 A1* | 12/2007 | Abadeer | B07C 5/344 257/368 |
| 2008/0157208 A1 | 7/2008 | Fischer | |
| 2008/0197394 A1* | 8/2008 | Caspary et al. | 257/300 |
| 2008/0296732 A1* | 12/2008 | Olson | 257/618 |
| 2009/0101995 A1* | 4/2009 | Beintner | H01L 29/7851 257/412 |
| 2009/0124097 A1 | 5/2009 | Cheng | |
| 2009/0242964 A1 | 10/2009 | Akil | |
| 2009/0269916 A1 | 10/2009 | Kang | |
| 2010/0022033 A1* | 1/2010 | Kanarik | H01L 22/20 438/14 |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2010/0197096 A1* | 8/2010 | Johnson | H01L 21/823431 438/268 |
| 2010/0248481 A1* | 9/2010 | Schultz | G06F 17/5068 438/694 |
| 2010/0267237 A1* | 10/2010 | Bonser | H01L 29/66795 438/689 |
| 2010/0267238 A1* | 10/2010 | Johnson | H01L 29/66795 438/692 |
| 2011/0014791 A1* | 1/2011 | Johnson | H01L 21/823431 438/696 |
| 2011/0021010 A1* | 1/2011 | Cheng | H01L 21/2236 438/513 |
| 2011/0021026 A1* | 1/2011 | Luning | H01L 21/3086 438/692 |
| 2011/0053361 A1* | 3/2011 | Muralidhar | H01L 21/3086 438/585 |
| 2013/0089984 A1* | 4/2013 | Raghunathan | H01L 21/0338 438/696 |
| 2013/0134486 A1* | 5/2013 | LiCausi | H01L 21/28132 257/288 |
| 2013/0143372 A1* | 6/2013 | Kim | H01L 21/3081 438/163 |
| 2013/0196508 A1* | 8/2013 | LiCausi | H01L 21/823821 438/696 |
| 2013/0244437 A1* | 9/2013 | Flachowsky | H01L 21/3086 438/703 |
| 2013/0334602 A1* | 12/2013 | Guo | H01L 21/845 257/347 |
| 2014/0159164 A1* | 6/2014 | Woo | H01L 21/3086 257/401 |
| 2014/0203279 A1* | 7/2014 | Bello | H01L 22/30 257/48 |
| 2014/0327074 A1* | 11/2014 | Tsao | H01L 27/0886 257/337 |
| 2014/0329388 A1* | 11/2014 | Jang | H01L 21/28141 438/702 |
| 2014/0339641 A1* | 11/2014 | Hong | H01L 27/0886 257/368 |
| 2014/0367833 A1* | 12/2014 | Brink | H01L 21/3088 257/618 |
| 2015/0011090 A1* | 1/2015 | Liang | H01L 21/31144 438/703 |
| 2015/0017781 A1* | 1/2015 | Lin | H01L 21/76224 438/424 |
| 2015/0056724 A1* | 2/2015 | Shieh | H01L 22/12 438/14 |
| 2015/0064913 A1* | 3/2015 | Omura | H01L 21/3088 438/696 |
| 2015/0236015 A1* | 8/2015 | Jeong | H01L 27/0886 257/401 |
| 2015/0241785 A1* | 8/2015 | Ishikawa | G03F 7/40 430/313 |
| 2015/0243503 A1* | 8/2015 | Leobandung | H01L 21/0337 438/427 |
| 2015/0287612 A1* | 10/2015 | Luere | H01L 21/0274 438/703 |
| 2015/0311085 A1* | 10/2015 | Kozarsky | H01L 21/3086 257/401 |
| 2015/0318181 A1* | 11/2015 | Cantone | H01L 29/66795 438/702 |

* cited by examiner

SIDEWALL IMAGE TRANSFER PROCESS

BACKGROUND OF THE INVENTION

1. Field of the Invention

The present invention is related to a sidewall image transfer (SIT) process, and more particularly, to a SIT process that comprises an automatic process control (APC) ability.

2. Description of the Prior Art

In modern society, the micro-processor systems comprising integrated circuits (IC) are ubiquitous devices, which are utilized in diverse fields such as automatic control electronics, mobile communication devices and personal computers. With the development of technologies and the increasingly imaginative applications of the electrical products, the IC devices become smaller, more delicate and more diversified.

For scaling down the size of the metal oxide semiconductor transistors (MOS), three-dimensional or non-planar transistor technology, such as fin field effect transistor (Fin-FET) technology has been developed to replace the planar MOS transistors. In current techniques, in order to meet the sub-lithographic requirements, a regular photolithography and an etching process are provided to form fin structures in the Fin-FETs. Additionally, semiconductor device manufacturers also utilize a pattern transfer technique, such as the sidewall image transfer (SIT) to form required fin structures.

However, since the CD of the fin structures is becoming smaller, many problems are met during the manufacturing process. Therefore, there is still a need for a novel SIT processes that can meet the CD requirement and reduce the manufacturing errors, so as to upgrade the yield of the products.

SUMMARY OF THE INVENTION

It is one objective of the present invention to provide a novel sidewall image transfer process that incorporates APC processes so as to ensure the manufacturing quality thereof.

According to one embodiment, a sidewall image transfer (SIT) process is provided. First, a substrate is provided. A sacrificial layer having a pattern is formed on the substrate. A first measuring step is performed to measure a width of the pattern of the sacrificial layer. A material layer is formed conformally on the sacrificial layer, wherein a thickness of the material layer is adjusted according to the result of the first measuring step. Then, the material layer is removed anisotropically, so the material layer becomes a spacer on a sidewall of the sacrificial layer. Lastly, the sacrificial layer is removed.

According to another embodiment of the present invention, an SIT process is provided. A substrate is provided. A sacrificial layer having a pattern is formed on the substrate. A material layer is formed conformally on the sacrificial layer. A first measuring step is performed to measure a thickness of the material layer. The material layer is removed anisotropically, so the material layer becomes a spacer on a sidewall of the sacrificial layer. A first trimming process is performed toward the spacer, wherein the trimming time of the first trimming process is adjusted according to the result of the first measuring step. Lastly, the sacrificial layer is removed.

The present invention provides a sidewall image transfer process that has an APC ability to ensure that the CD of the final pattern and the space between each pattern are on target. The APC ability is achieved by using at least a measure step to detect in-situ the width of the sacrificial layer and/or the thickness of the material layer, so that the subsequent steps can adjust the thickness of the material layer or the trimming time according to the measured results.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Figure 1:
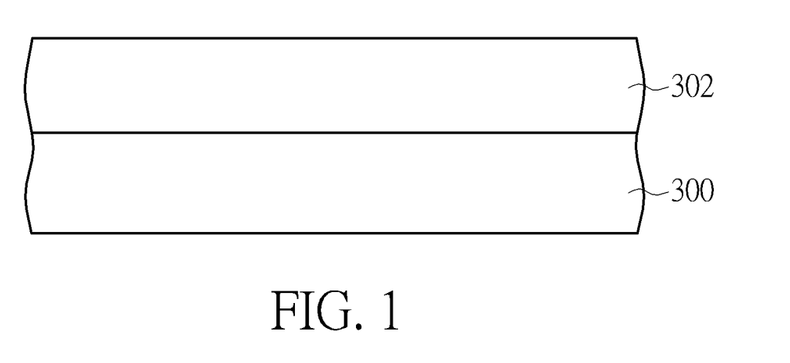
FIG. 1 to FIG. 7 are schematic diagrams of the SIT process according to the first embodiment of the present invention.

Please refer to FIG. 1 to FIG. 7, which are schematic diagrams of the SIT process according to the first embodiment of the present invention. As shown in FIG. 1, a substrate 300 is provided. In one embodiment, the substrate 300 can include a semiconductor substrate, such as a silicon substrate, an epitaxial silicon substrate, a silicon germanium substrate, a silicon carbide substrate or a silicon-on-insulator (SOI) substrate. In another embodiment, the substrate 300 can include a non-semiconductor substrate, such as a glass substrate for a thin-film-transistor display device formed thereon, or a fused quartz for a photo-mask formed thereon. In another embodiment, the substrate 300 can include a plurality of doping regions, one or a plurality of dielectric layers or a metal interconnect system in which one or a plurality of microelectronic components are disposed therein, such as a complementary metal oxide semiconductor (CMOS) or a photo-diode. A mask layer 302 is then formed on the substrate 300. In one embodiment, the mask layer 302 can be of a single layer or a multi-layer that can be used as a hard mask. For example, the mask layer 302 can include silicon nitride (SiN), silicon oxynitride (SiON), metal or an advanced pattern film (APF) provided by Applied Material. In another embodiment, the mask layer 302 can include a $SiO_2/SiN/SiO_2$ tri-layered structure.

Figure 2:
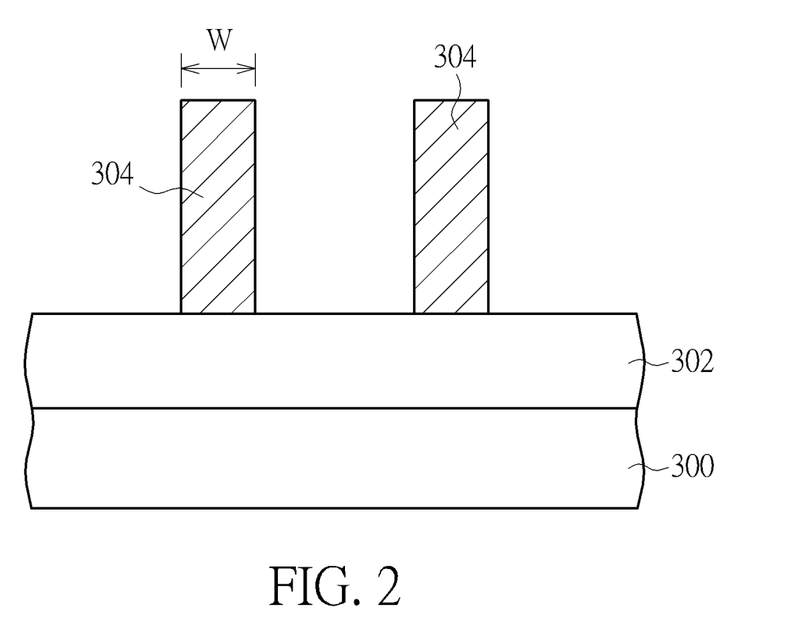

As shown in FIG. 2, a sacrificial layer 304 with a pattern is formed on the mask layer 302. For example, a poly-silicon or an amorphous silicon layer is formed comprehensively on the mask layer 302. A lithography etching process (PEP) is then carried out to form the sacrificial layer 304 having patterns, wherein each pattern has a width W. In the present embodiment, an adjusting step will be performed in the subsequent steps to adjust the final width of the pattern, so that the width W of the sacrificial layer 304 can be designed a little smaller than that in conventional arts.

Moreover, since there are many manufacturing effects such as optical proximity effect that may affect the final results, the excepted width of the pattern may not be the same as the actual width of the formed pattern. The manufacturing methods in conventional arts are unable to reveal the actual parameters so the subsequent steps are based on incorrect results. Accordingly, the present invention uses the concept of automatic process control (APC) to monitor and adjust in-situ the manufacturing parameters. For example, after forming the sacrificial layer 304, a measuring step is performed to measure the actual width W of the sacrificial layer 304, for example, by a detector disposed in the semiconductor equipment where the manufacturing processes are performed.

Figure 3:
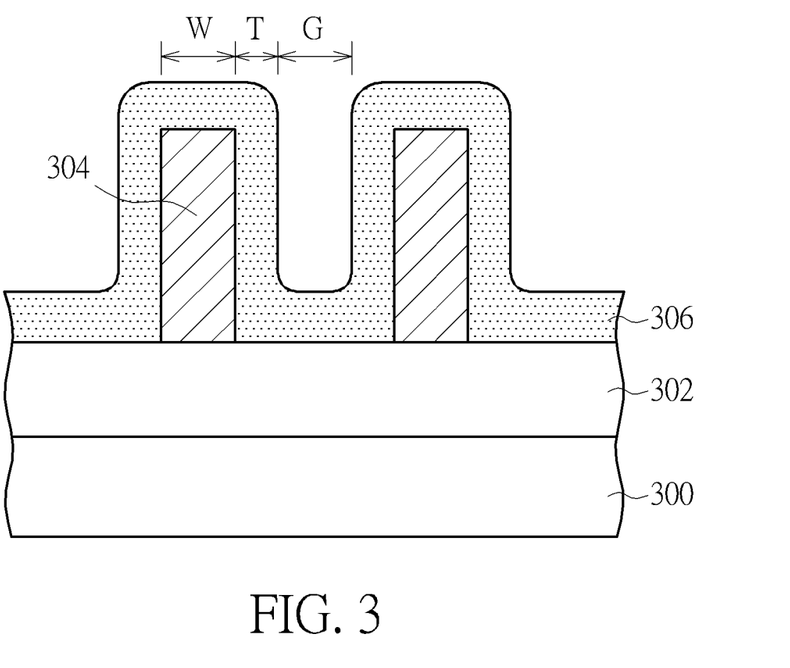

Then, as shown in FIG. 3, a material layer 306, such as a silicon nitride (SiN) layer, is formed conformally on the sacrificial layer 304. The method of forming the material layer 306 can include a chemical vapor deposition (CVD) process or an atomic layer deposition (ALD) process. In the present embodiment, the thickness of the material layer 306 is adjusted according to the width W of the sacrificial layer 304 obtained in the measuring step. In one embodiment, as shown in FIG. 3, the thickness T of the material layer 306 is adjusted so that a gap G between two facing material layers 306 on the sidewalls of the sacrificial layer 304 is substantially equal to the width W of the sacrificial layer 304.

Figure 4:
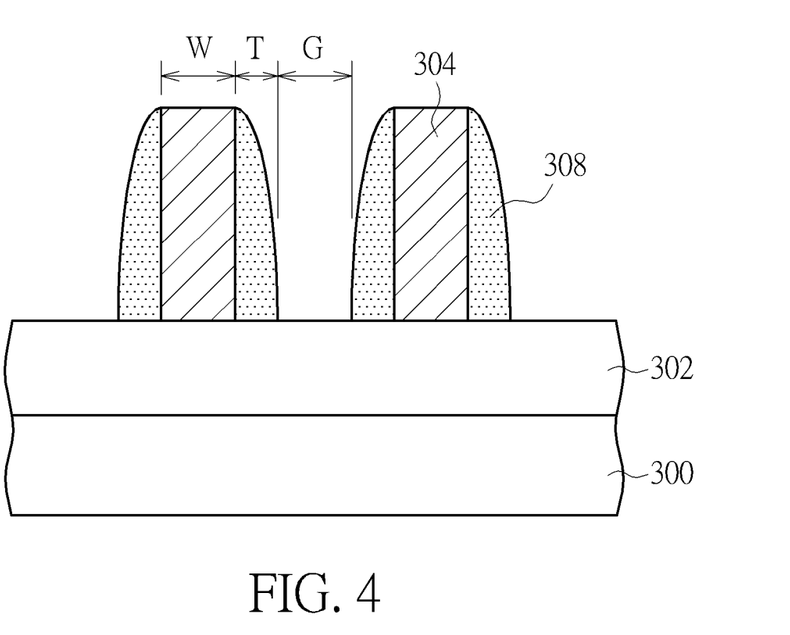

Then, as shown in FIG. 4, the material layer 306 is anisotropically removed until a top surface of the sacrificial layer 304 and the mask layer 302 is exposed. The material layer 306 becomes a spacer 308 on the sidewall of the sacrificial layer 304. It is understood that the spacer 308 also has the width W.

Figure 5:
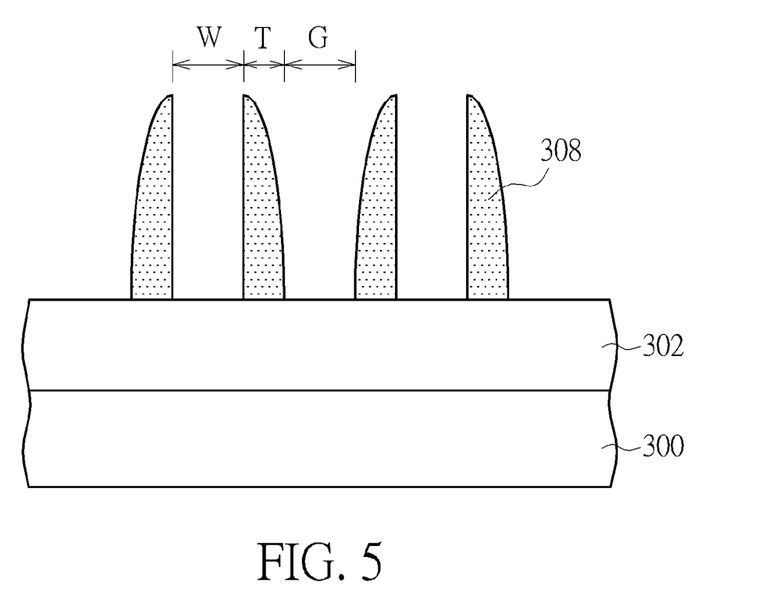

As shown in FIG. 5, the sacrificial layer 304 is completely removed, but the spacer 308 still remains on the mask layer 302. Since the gap G between the material layer 306 is equal to the width W of the sacrificial layer 304, i.e. G=W, so after removing the patterned first material layer 308, the spacing (W and G) between each spacer 308 remains the same.

Figure 6:
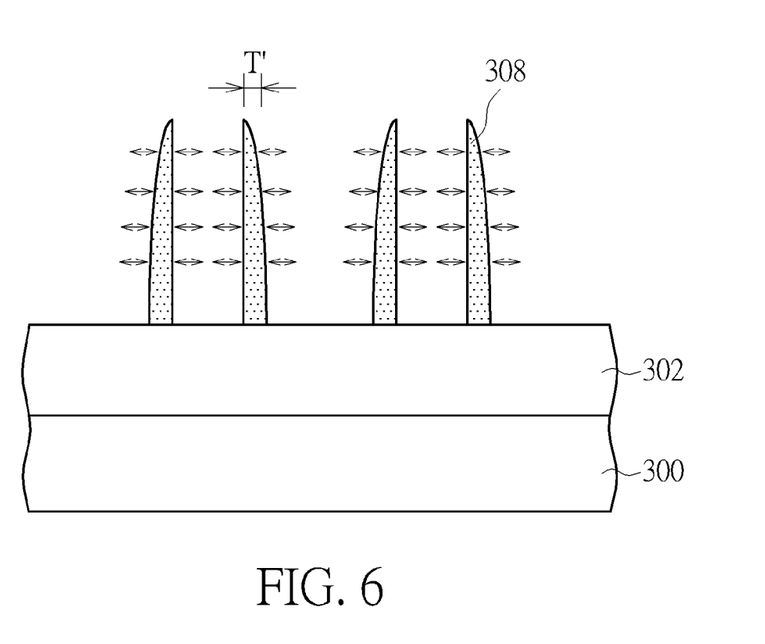

Then, as shown in FIG. 6, an isotropic etching process such as a trimming process is performed toward the spacer 308. The sidewall of the spacer 308 is trimmed, for example by using suitable plasma gases to slightly reduce the width of the spacer 308. After the trimming process, the width of the spacer 308 is reduced from T to T', which is the final desired critical dimension (CD) of the pattern. Since the spacing between each spacer 308 is equal, so even after the trimming process that isotropically removes the spacer 308 along the horizontal direction, the spacing between each spacer 308 is still the same and no shifting problem would occur in the present invention. In the present embodiment, the trimming time can also be adjusted according to the measured results of the sacrificial layer width W. The thicker the material layer 306 is, the longer trimming time will be required in the process, in order to achieve the correct final pattern spacing and CD.

Figure 7:
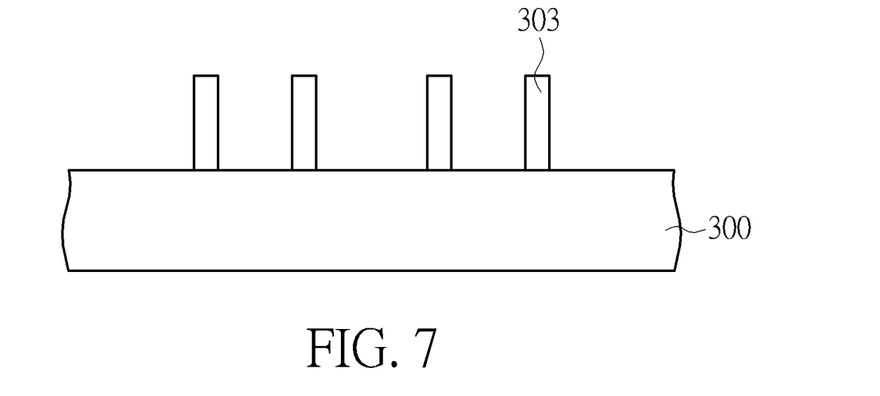

As shown in FIG. 7, an etching process is performed by using the trimmed spacer 308 as a mask to pattern the mask layer 302, thereby forming a patterned mask layer 303. Consequently, the pattern of the spacer 308 with a desired width T' is transferred to the mask layer 303. Thereafter, the pattern of the patterned mask layer 303 can be further transferred to the substrate 300 to form a desired semiconductor structure in the substrate 300, such as a fin structure of a Fin-FET, or a word line of a dynamic random access memory (DRAM), and is not limited thereto. In one embodiment, after forming the patterned mask layer 303, the patterned mask layer 303 can undergo a trimming process again, in which the time of the trimming process can be adjusted according to the measured result of the width W of the sacrificial layer 304. In another embodiment, the mask layer 302 can be omitted so the pattern of the spacer 308 can be directly transferred to the substrate 300.

In the abovementioned embodiment, a measuring step is performed to measure the width W of the sacrificial layer 304 in-situ, so that, in the subsequent step, the thickness of the material layer 306 can be decided, and the trimming process toward the spacer 308 can be adjusted, wherein both of these processes are based on the measured result of the actual width W of the sacrificial layer 304. By doing this, the spacings between every spacer 308 can be equal to each others and a correct final pattern spacing and CD can be obtained. In addition, since the width of the pattern can be adjusted in the final trimming step, the original width W of the sacrificial layer 304 can be designed to be smaller than that in conventional arts, thereby giving more margins to the manufacturing processes.

Figure 8:
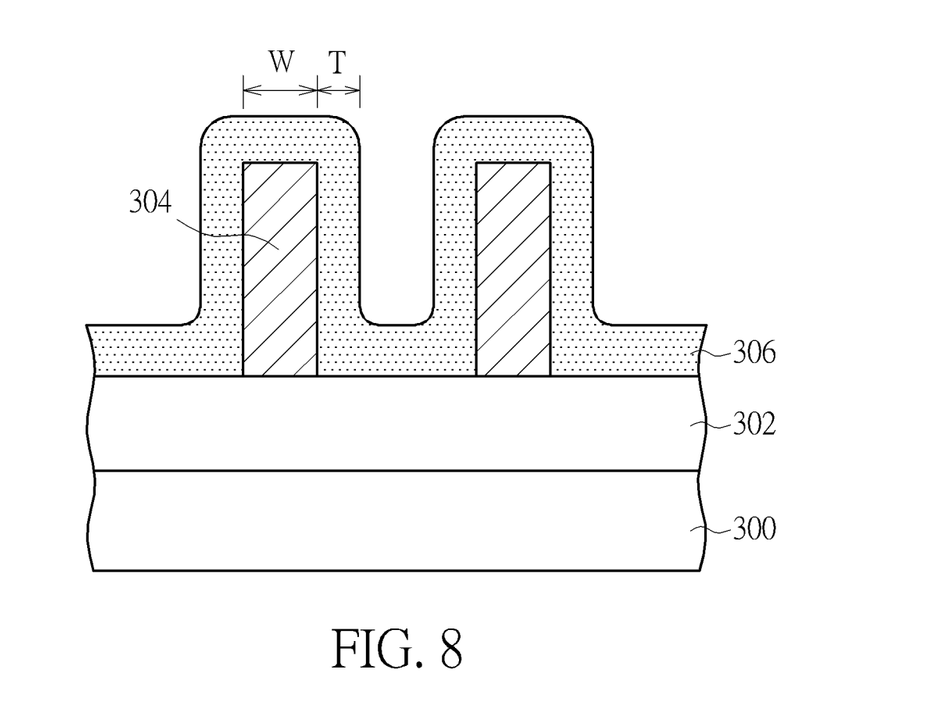
FIG. 8 and FIG. 9 are schematic diagrams of the SIT process according to the second embodiment of the present invention.
Figure 9:
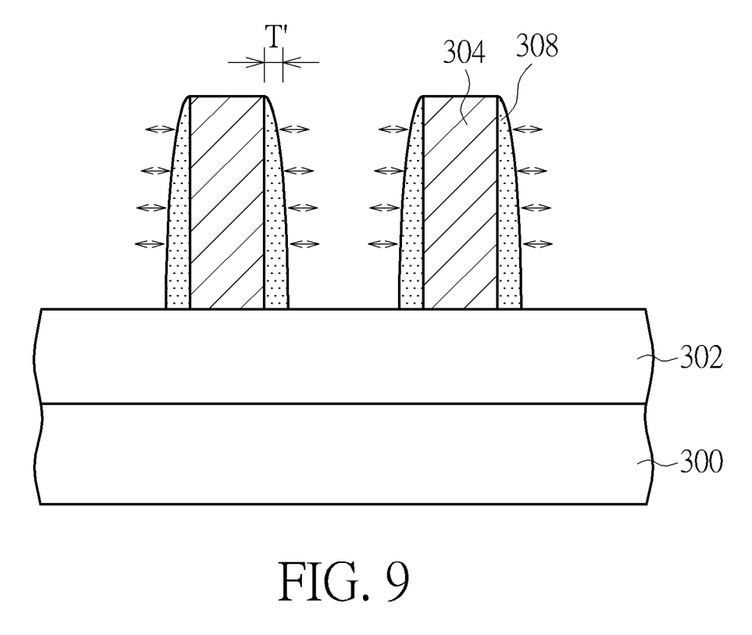

Please refer to FIG. 8 to FIG. 9, which are schematic diagrams of the SIT process according to the second embodiment of the present invention. The previous steps in the second embodiment are similar to those in the first embodiment as in FIG. 1 to FIG. 2. After the steps in FIG. 1 and FIG. 2, please see FIG. 8. A material layer 306 is formed conformally on the sacrificial layer 304. Compared with the first embodiment that measures the width of the sacrificial layer 304 and forms the material layer 306 based on the measured result, the second embodiment measures the thickness of the material layer 306 instead of the width of the sacrificial layer 304. That is, a measuring step is performed to measure the actual thickness T of the material layer 306 in-situ to obtain the actual thickness thereof.

The second material layer 308 is then removed anisotropically to form a spacer 308, as shown in FIG. 4 of the first embodiment. As shown in FIG. 9, an isotropic etching process such as a trimming process is then performed to slightly reduce the width of the spacer 308. In the present embodiment, the trimming process is performed according to the measured result of the thickness of the material layer 306. After the trimming process, the width of the spacer 308 has the desired value. Then, the sacrificial layer 304 is removed and the pattern of the spacer 308 can be transferred to the mask layer 302, as shown in FIG. 7 of the first embodiment.

In the second embodiment, a measuring step is used to measure the thickness of the second material layer 308 and the thickness thereof can be slightly adjusted in the trimming process. It is noted the second embodiment focuses on the thickness of the second material 306 (which will become the spacer 308), so the trimming process is performed before removing the sacrificial layer 304. By doing this, the trimming process in the second embodiment can directly compensate the thickness of the material layer 306. On the other hand, the trimming process in the first embodiment focuses both on the spacing between each spacer 308 and the final CD of the spacer 308, so it is performed after removing the sacrificial layer 304 and is based on the width W of the sacrificial layer 304 and/or the thickness of the material layer 306.

Figure 10:
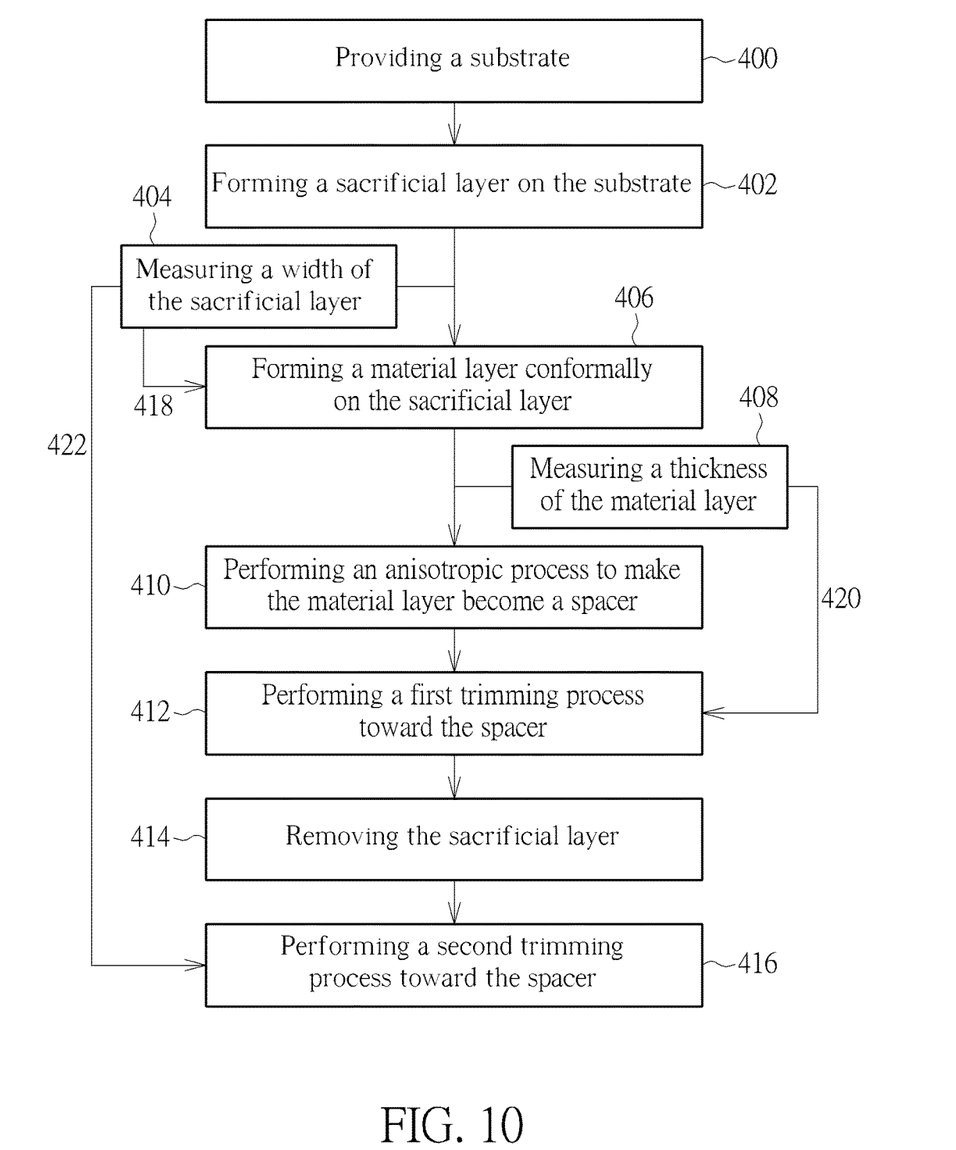
FIG. 10 is a flow chart of the SIT process of the present invention.

In another embodiment, the first embodiment and the second embodiment can be incorporated. Please refer to FIG. 10, which shows a flow chart of the SIT process in the present invention. The process includes the following steps in sequence:

Step 400: providing a substrate.
Step 402: forming a sacrificial layer on the substrate.
Step 406: forming a material layer conformally on the sacrificial layer.

Step 410: performing an anisotropic process to make the material layer become a spacer.

Step 412: performing a first trimming process toward the spacer.

Step 414: removing the sacrificial layer.

Step 416: performing a second trimming process toward the spacer.

In one embodiment, after the sacrificial layer is formed, a width of the sacrificial layer is measured (step 404). The thickness of the second material layer is determined by the result measured in step 404 (step 418). The time of the second trimming process in step 416 is adjusted according to the result measured in step 404 (step 422). Thus, the automatic process control ability can be achieved by the measuring step in step 404 and the adjusting steps in step 418 and/or step 422.

In another embodiment, after the material layer is formed, a thickness of the material layer is measured (step 408). The time of the first trimming process in step 412 is adjusted according to the result measured in step 408 (step 420). Thus, the automatic processing control ability can be provided by the measuring step in step 408 and the adjusting step in step 420.

In summary, the present invention provides a sidewall image transfer process that has an APC ability to ensure that the CD of the final pattern and the space between each pattern correspond to the target. The APC ability is achieved by using at least a measuring step to detect in-situ the width of the sacrificial layer and/or the thickness of the material layer, so that the subsequent adjusting steps can adjust the thickness of the material layer or the trimming time according to the measured results.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sidewall image transfer process, comprising:
providing a substrate;
forming a sacrificial layer having a pattern on the substrate;
performing a first measuring step to measure a width of the pattern of the sacrificial layer;
forming a material layer conformally on the sacrificial layer, wherein a thickness of the material layer is adjusted according to a result of the first measuring step;
performing a second measuring step to measure a thickness of the material layer;
removing the material layer anisotropically after performing the second measuring step, so the material layer becomes a spacer on a sidewall of the sacrificial layer;
performing a first trimming process toward the spacer, wherein the trimming time of the first trimming process is adjusted according to a result of the second measuring step, the first trimming process performed toward the spacer reduces a width of the spacer, and the width of the spacer after the first trimming process is less than the thickness of the material layer; and
removing the sacrificial layer after the first trimming process.

2. The sidewall image transfer process according to claim 1, wherein the thickness of the material layer is adjusted to have a gap width of a gap between two facing material layers on the sidewalls of the sacrificial layer equal to a width of the sacrificial layer.

3. The sidewall image transfer process according to claim 1, further comprising performing a second trimming process toward the spacer after removing the sacrificial layer.

4. The sidewall image transfer process according to claim 3, wherein the trimming time of the second trimming process is adjusted based on the thickness of the material layer measured in the second measuring step so as to control a spacing of the spacer.

5. The sidewall image transfer process according to claim 1, wherein the sacrificial layer comprises poly-silicon or amorphous silicon.

6. The sidewall image transfer process according to claim 1, wherein the material layer comprises silicon nitride.

7. The sidewall image transfer process according to claim 1, further comprising forming a mask layer on the substrate before forming the material layer.

8. The sidewall image transfer process according to claim 7, further comprising patterning the mask layer by using the spacer as a mask after removing the sacrificial layer.

9. The sidewall image transfer process according to claim 1, wherein the sacrificial layer is partially uncovered by the material layer after the step of removing the material layer anisotropically, and the first trimming process is performed after the spacer is formed and the sacrificial layer is partially uncovered by the material layer.

10. The sidewall image transfer process according to claim 1, wherein a width of the pattern of the sacrificial layer is unchanged after the step of forming the material layer.

11. The sidewall image transfer process according to claim 1, wherein the thickness of the material layer is adjusted based on the width of the pattern of the sacrificial layer during the step of forming a material layer conformally on the sacrificial layer.

12. The sidewall image transfer process according to claim 3, further comprising performing a second trimming process toward the spacer after the step of removing the sacrificial layer so as to control a spacing of the spacer, wherein a trimming time of the second trimming process is adjusted based on a width of the pattern of the sacrificial layer.

* * * * *